US008188955B2

(12) United States Patent
Tsai et al.

(10) Patent No.: US 8,188,955 B2
(45) Date of Patent: May 29, 2012

(54) SOURCE DRIVING CIRCUIT WITH OUTPUT BUFFER

(75) Inventors: Chien-Hung Tsai, Tainan (TW); Jia-Hui Wang, Tainan (TW); Jing-Chuan Qiu, Tainan (TW); Chen-Yu Wang, Tainan County (TW)

(73) Assignees: Himax Technologies Limited, Tainan (TW); NCKU Research & Development Foundation, Tainan (TW)

( * ) Notice: Subject to any disclaimer, the term of this patent is extended or adjusted under 35 U.S.C. 154(b) by 778 days.

(21) Appl. No.: 12/258,957

(22) Filed: Oct. 27, 2008

(65) Prior Publication Data

US 2010/0103152 A1 Apr. 29, 2010

(51) Int. Cl.
*H03F 3/45* (2006.01)

(52) U.S. Cl. .......................... 345/87; 345/209; 330/255

(58) Field of Classification Search .................. 330/255, 330/264; 324/433; 345/96, 209, 87
See application file for complete search history.

(56) References Cited

U.S. PATENT DOCUMENTS

| | | | | |
|---|---|---|---|---|
| 4,379,267 | A * | 4/1983 | Young | 330/253 |
| 4,553,098 | A * | 11/1985 | Yoh et al. | 324/433 |
| 4,988,954 | A * | 1/1991 | Stern et al. | 330/264 |
| 6,879,212 | B2 * | 4/2005 | Suzuki | 330/255 |
| 7,348,848 | B2 * | 3/2008 | Huang | 330/253 |
| 7,551,030 | B2 * | 6/2009 | An et al. | 330/255 |
| 7,786,799 | B2 * | 8/2010 | Bhattacharya et al. | 330/253 |
| 2002/0036609 | A1 * | 3/2002 | Kajihara et al. | 345/87 |
| 2005/0168432 | A1 | 8/2005 | Park | |
| 2007/0097056 | A1 * | 5/2007 | Tseng | 345/96 |
| 2008/0191804 | A1 * | 8/2008 | An et al. | 330/255 |
| 2008/0204439 | A1 * | 8/2008 | Morita | 345/209 |
| 2008/0304439 | A1 * | 12/2008 | Keevill et al. | 370/328 |

FOREIGN PATENT DOCUMENTS

| | | |
|---|---|---|
| JP | 61-296805 | 12/1986 |

OTHER PUBLICATIONS

Johns, et al., Analog Integrated Circuit Design, 1997, John Wiley and Sons, 1st Ed., p. 142-147.*

"First Office Action of China Counterpart Application", issued on Jul. 21, 2011, p. 1-p. 5, in which the listed references were cited.

* cited by examiner

*Primary Examiner* — Quan-Zhen Wang
*Assistant Examiner* — Michael J Eurice
(74) *Attorney, Agent, or Firm* — J.C. Patents

(57) ABSTRACT

A source driving circuit adapted to drive a display panel is provided herein. The source driving circuit includes a first output buffer and a second output buffer responsible for enhancing signals with different polarities respectively. As for the first output buffer, the first output buffer includes a first differential input stage, a first output stage and a second output stage. The first output stage includes a first level adjustment circuit and a first self-bias providing circuit. The first level adjustment circuit provides a first level voltage according to input signals received by the first differential input stage, such that the second output stage thereby provides a first charge current and a second charge current to output a first output signal based on the first level voltage. The first self-bias providing circuit provides a first biased voltage associated with one input signal to control the first level adjustment circuit to operate.

13 Claims, 3 Drawing Sheets

SOURCE DRIVING CIRCUIT WITH OUTPUT BUFFER

BACKGROUND OF THE INVENTION

1. Field of Invention

The present invention relates to a source driving circuit, and more particular, a source driving circuit with high efficiency and low consumption.

2. Description of Related Art

Various types of electronic devices have display devices, such as TVs, laptop computers, monitors and mobile communication terminals. The display devices are requested to be thin and/or light in order to save the volume and the cost of the electronic devices. To satisfy these requirements, various Flat Panel Displays (FPDs) have been developed as alternatives to more conventional cathode ray tube displays.

A liquid crystal display (LCD) is one kind of the FPDs. In the LCD device, a source driver plays an important role, which converts the digital video data into driving voltages and delivers the driving voltages to pixels on a display panel of the LCD. The source driver includes an output buffer for enhancing the driving ability of the driving voltage so as to avoid signal attenuation.

FIG. 1 shows a conventional output buffer 100 of a source driver. The output buffer 100 includes an input stage 110, a current source, and an output stage 120. The input stage 110 includes transistors N1 through N4. The transistors N1 and N2 compose a differential pair which receives differential input signals at input nodes Vin+ and Vin−. The current source implemented by a transistor N5 provides a bias current to the input stage 110. The output stage 120 includes transistors N6 through N9 to output an output voltage at an output node Vout according to the differential input signals at input nodes Vin+ and Vin−.

The output buffer 100 is used as a unit-gain buffer by connecting the output node Vout to the input node Vin−, such that the output buffer 100 is under a static state when the differential input signals at the input nodes Vin+ and Vin− are equal. When the output buffer 100 is under a transient state, it can either be under a charge state or under a discharge state. If the signal at the input node Vin+ is higher than the signal at the input node Vin−, the output buffer 100 is under the charge state so as to pull high the voltage at the output node Vout. During this charge state, the current flowing through transistors N1 and N3 is comparatively larger than the current flowing through the transistors N2 and N4, such that the charge current $I_{ch}$ flowing through the transistor N8, mirrored from the current from the transistor N3, is rising so as to quickly pull high the voltage at the output node Vout.

If the signal at the input node Vin− is higher than the signal at the input node Vin+, the output buffer 100 is under the discharge state. During this discharge state, the current flowing through the transistors N2 and N4 is comparatively larger than the current flowing through the transistors N1 and N3, such that the charge current flowing through the transistor N9, mirrored from the current from the transistor N4, becomes larger, and thus the discharge current $I_{disch}$, mirrored from the current of transistor N6, is rising to quickly pull low the voltage at the output node Vout.

However, the size of the display panel is getting larger, and thus the larger charge current $I_{ch}$ and the discharge current $I_{disch}$ are required for driving larger display panel.

SUMMARY OF THE INVENTION

For solving the problem mentioned above, the invention provides a source driving circuit with high efficiency and low consumption to drive a display panel. The source driving circuit adapted to drive the display panel includes a first output buffer. The first output buffer includes a first differential input stage, a first output stage and a second output stage. The first differential input stage receives a first input signal and a second input signal via a first input terminal and a second input terminal respectively. The first output stage includes a first level adjustment circuit and a first self-bias providing circuit. The first level adjustment circuit provides a first level voltage according to the signals received by the first differential input stage. The self-bias providing circuit provides a first biased voltage to the first level adjustment circuit. The second output stage provides a first charge current and a first discharge current to output a first output signal based on the first level voltage.

In an embodiment of the foregoing source driving circuit, the source driving circuit further includes a second output buffer. The second output buffer includes a second differential input stage, a third output stage and a fourth output stage. The second differential input stage receives a third input signal and a fourth input signal via a third input terminal and a fourth input terminal respectively. The third output stage includes a second level adjustment circuit, and a second self-bias providing circuit. The second level adjustment circuit provides a second level voltage according to the signals received by the second differential input stage. The second self-bias providing circuit provides a second biased voltage to the first level adjustment circuit and the second level adjustment circuit. The fourth output stage provides a second charge current and a second discharge current to output a second output signal based on the second level voltage.

In an embodiment of the foregoing source driving circuit, a first current and a second current are generated in the first differential input stage respectively according to the first input signal and the second input signal. The first level adjustment circuit receives a first level current mirrored from the first current or the second current to generate the first level voltage. In addition, a third current and a fourth current are generated in the second differential input stage respectively according to the third input signal and the fourth input signal. The second level adjustment circuit receives a second level current mirrored from the third current or the fourth current to generate the second level voltage.

In an embodiment of the foregoing source driving circuit, the first self-bias providing circuit generates the first biased voltage based on the second current. In addition, the second self-bias providing circuit generates the second biased voltage based on the fourth current.

The present invention provides a source driving circuit including an output buffer with two output stages for increasing the driving ability. As for the output buffer, the level adjustment circuit in the first of the output stages can dynamically adjust the level voltage according to the signals received by the differential input stage for controlling the last one of the output stages. In addition, the level adjustment circuit is biased by the self-bias providing circuit within the output buffer. The bias voltage provided by the self-bias providing circuit is associated with one of currents induced in the differential input stage. Therefore, the source driving circuit can increase the charge and the discharge abilities more efficiently.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
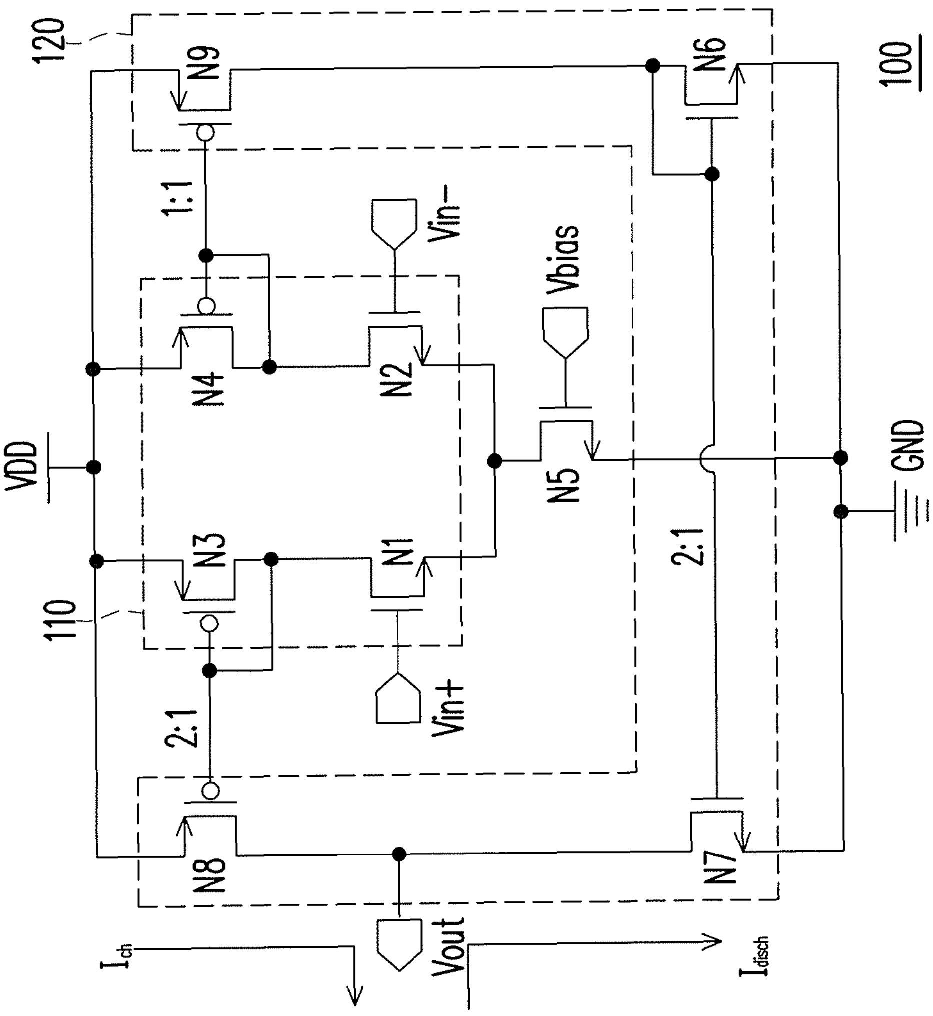
FIG. 1 (PRIOR ART)
FIG. 1 shows a conventional output buffer of a source driver.

Reference will now be made in detail to the present embodiments of the invention, examples of which are illustrated in the accompanying drawings. Wherever possible, the same reference numbers are used in the drawings and the description to refer to the same or like parts.

Figure 2:
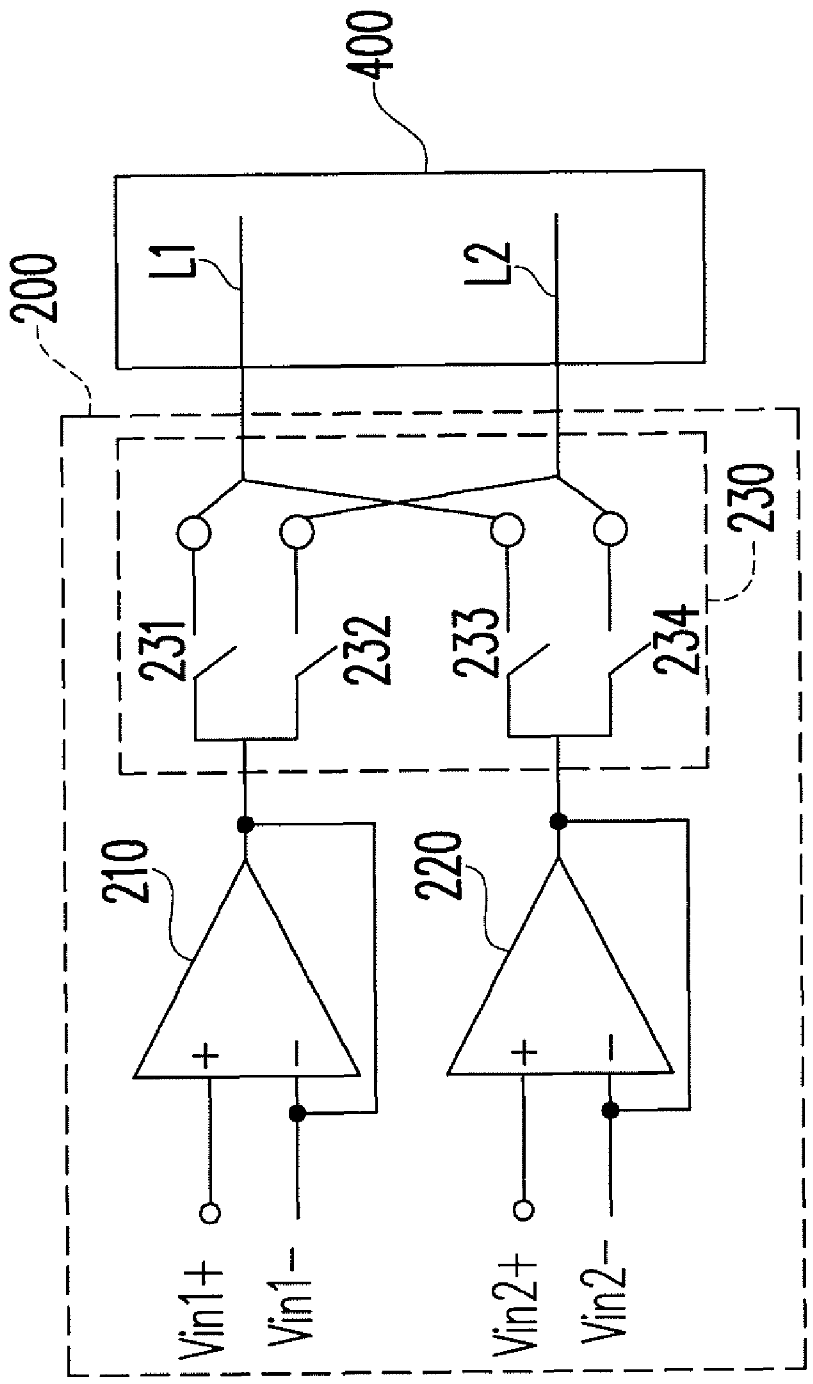
FIG. 2 shows a diagram of a source driving circuit according to an embodiment of the present invention.

An output buffer for providing larger charge current and discharge current is provided in the embodiment of the invention. The output buffer is for example used in a source driving circuit of a display panel. FIG. 2 shows a diagram of a source driving circuit 200 according to an embodiment of the present invention. In FIG. 2, the source driving circuit 200 includes a positive polarity output buffer 210, a negative polarity output buffer 220, and a multiplexer 230. The multiplexer 230 including switches 231 through 234, selectively couples the output buffers 210 and 220 to data lines L1 and L2 of the display panel 400.

Figure 3:
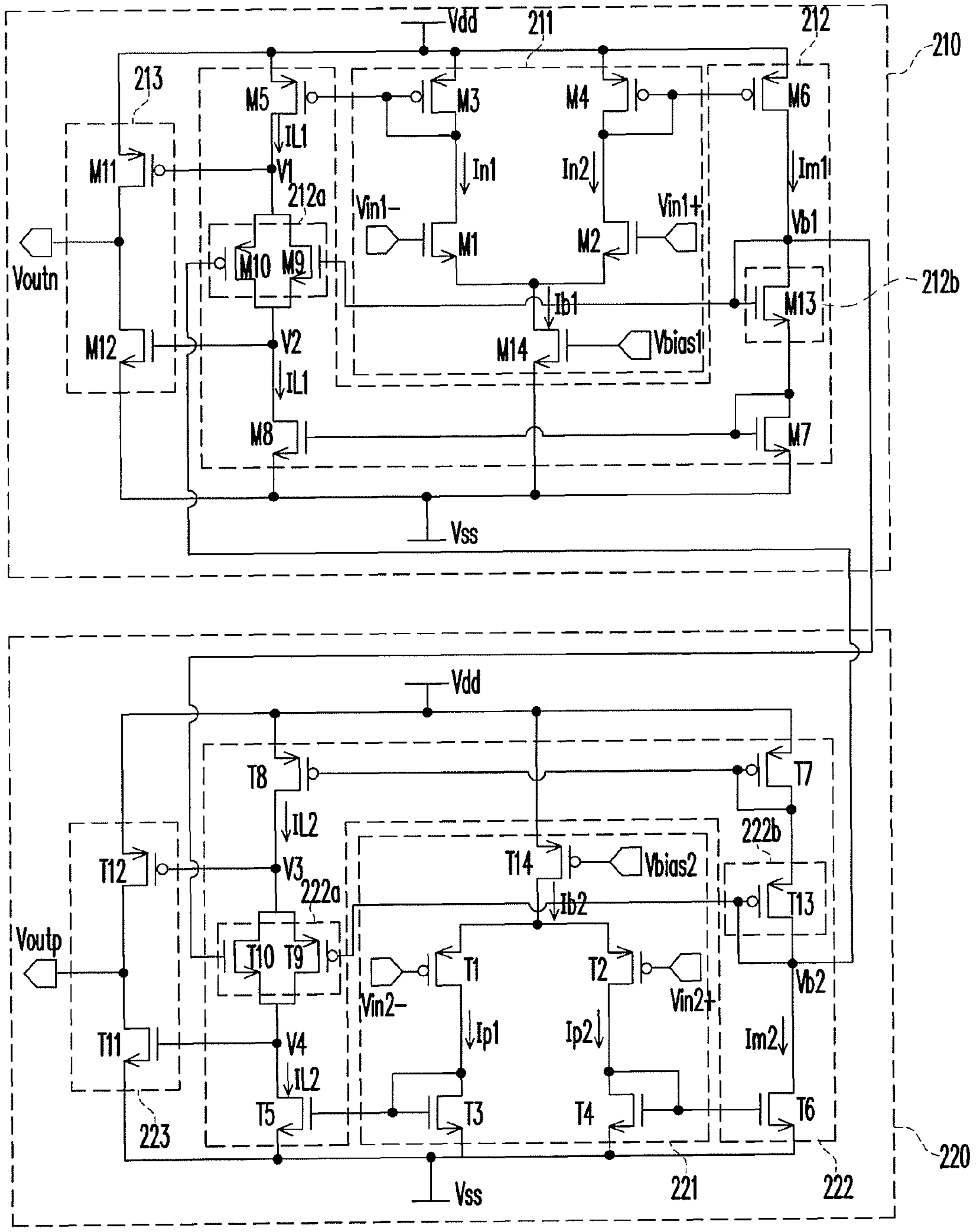
FIG. 3 shows a circuit diagram of the output buffers according to the embodiment in FIG. 2.

FIG. 3 shows the detailed circuit of the positive polarity output buffer 210 and the negative polarity output buffer 220 in FIG. 2. The positive polarity output buffer 210 includes a differential input stage 211, a first output stage 212 and a second output stage 213. The differential input stage 211 includes transistors M1 through M4, wherein the transistors M1 and M2 are N-type transistors composing an N-type differential pair. The differential input stage 211 respectively receives a first input signal and a second input signal via a first input terminal Vin1− and a second input terminal Vin1+. The differential input stage 211 further includes a current source implemented by a transistor M14 for providing a first bias current Ib1 to the differential input stage 211, so that a first current In1 and a second current In2 are induced in the differential input stage 211 according to the signals at the input terminals Vin1+ and Vin1−, wherein a sum of the first current In1 and the second current In2 are nearly equal to the first bias current Ib1. In FIG. 3, the current source implemented by the transistor M14 couples between the second source/drain of the transistor M1 and a first voltage (e.g., a negative power supply voltage Vss). The first drain/source of the transistor M3 and the first drain/source of the transistor M4 are coupled to a second voltage(e.g., an operation voltage Vdd).

The first output stage 212 includes transistors M5 through M8, a level adjustment circuit 212*a* and a self-bias providing circuit 212*b*. The transistors M3 and M5 compose a mirror circuit structure for mirroring the first current In1 to generate a first level current IL1 flowing through the transistor M5. The transistors M6 through M8 also compose a cascade mirror circuit structure for mirroring the second current In2 to generate the first level current IL1 flowing through the transistor M8. The transistors M5 and M8 and the level adjustment circuit 212*a* are in the same current path, so that the current flowing through the transistor M5 and the current flowing through the transistor M8 are the same current, i.e. the first level current IL1, when the level adjustment circuit 212*a* forms a short circuit. The level adjustment circuit 212*a* including transistors M9 and M10 provides a first level voltage at the first node V1 and a second level voltage at the second node V2 based on the differential input stage 211 so as to drive the second output stage 213. The level adjustment circuit 212*a* receives the first level current IL1, mirrored from the first current In1 or the second current In2 to generate the first level voltage and the second level voltage.

The self-bias providing circuit 212*b* including a self-bias transistor M13 provides a first biased voltage Vb1 based on the second current In2 to control the level adjustment circuit 212*a*. In the embodiment of the present invention, the self-bias transistor M13 is coupled between the transistors M6 and M7, and thus the self-bias transistor M13 receives a first mirroring current Im1, mirrored from the second current In2, to generate the first biased voltage Vb1. The second output stage 213 includes transistors M11 and M12. The second output stage 213, controlled by the voltages at the nodes V1 and V2, outputs an output signal at a first output node Voutn. When the transistor M11 is turned on, the second output stage 213 would provide a first charge current. When the transistor M12 is turned on, the second output stage 213 would provide a first discharge current.

When the input voltage at the first input terminal Vin1− (i.e. the first input signal) is greater than the input voltage at the second input terminal Vin1+ (i.e. the second input signal), the output buffer 210 is under a discharge state to pull low the output voltage at the first output node Voutn. That is, the first current In1 flowing through the transistors M1 and M3 is greater than the second current In2 flowing through the transistors M2 and M4. Therefore, the first level current IL1 flowing through the transistor M5, mirrored from the first current In1, becomes larger to pull high the voltages at the first node V1 and the second node V2. As a result, the transistor M12 of the second output stage 213, controlled by the second level voltage at the second node V2, is turned on to provide the first discharge current and pull low the output voltage at the first output node Voutn.

When the input voltage at the first input terminal Vin1− (i.e. the first input signal) is less than the input voltage at the second input terminal Vin1+ (i.e. the second input signal), the output buffer 210 is under a charge state to pull high the output voltage at the first output node Voutn. That is, the second current In2 flowing through transistors M2 and M4 is greater than the first current In1 flowing through the transistors M1 and M3. Therefore, the first mirroring current Im1 flowing through the transistor M6, mirrored from the second current In2, becomes larger, such that the first level current IL1 flowing through the transistor M8, mirrored from the first mirroring current Im1, also becomes larger so as to pull low the voltages at the first node V1 and the second node V2. As a result, the transistor M11 of the second output stage 213, controlled by the first level voltage at the first node V1, is turned on to provide the first charge current and pull high the output voltage at the first output node Voutn.

In the embodiment of the present invention, the level adjustment circuit 212*a* is properly biased to adjust the first level voltage at the first node V1 and the second level voltage at the second node V2, which controls the second output stage 213. The transistor M9 of the level adjustment circuit 212*a* is biased by the first biased voltage Vb1 associated with the second current In2. The transistor M10 of the level adjustment circuit 212*a* is biased by a second biased voltage Vb2 associated with the negative polarity output buffer 220 (it will be described later). Therefore, the level adjustment circuit 212*a* dynamically adjusts level voltages of the first node V1 and the second node V2 responsive to the dynamic state of output buffer 210. In addition, the level adjustment circuit 212*a* keeps the gates of the transistors M11 and M12 having a small voltage offset for avoiding the transistors M11 and M12 to turn on simultaneously.

It is noted that under the static state of the output buffer 210, the source-gate voltage of the transistor M11 and the gate-source voltage of the transistor M12 in the second output stage 213 are small, and thus the power consumption mostly determined by the static current is small.

The negative polarity output buffer 220 is discussed in the following paragraphs. The negative polarity output buffer 220 includes a differential input stage 221, a first output stage 222 and a second output stage 223. The differential input stage 221 includes transistors T1 through T4, wherein the transistor T1 and T2 are P-type transistors composing a P-type differential pair. The differential input stage 221 respectively receives a third input signal and a fourth input signal via a third input terminal Vin2− and a fourth input terminal Vin2+. The differential input stage 221 further includes a current source implemented by a transistor T14 for providing a second bias current Ib2 to the differential input stage 221, so that a third current Ip1 and a fourth current Ip2 are induced in the differential input stage 221 according to the signals at the input terminals Vin2− and Vin2+.

The first output stage 222 includes transistors T5 through T10 and T13. The transistor T5 mirrors the third current Ip1 to generate a second level current IL2 flowing through the transistor T5. The transistor T6 mirrors the fourth current Ip2 to generate a second mirroring current Im2, and the transistors T7 and T8 cooperate to mirror the second mirroring current Im2 to generate the second level current IL2 flowing through the transistor T8. The transistors T9 and T10 of the first output stage 222 are used as a level adjustment circuit 222*a* for providing voltages at the third node V3 and the fourth node V4 based on the differential input stage 221 so as to drive the second output stage 223. The transistor T13 of the first output stage 222 is used as a self-bias transistor for providing the second bias voltage Vb2 to control the level adjustment circuits 212*a* of the positive polarity output buffer 210 and to control the level adjustment circuit 222*a*. Moreover, the level adjustment circuit 222*a* is also controlled by the first bias voltage Vb1. The second output stage 223 includes transistors T11 and T12.

When the input voltage at the fourth input terminal Vin2+ (i.e. the fourth input signal) is greater than the input voltage at the third input terminal Vin2− (i.e. the third input signal), the output buffer 220 is under a charge state to pull high the output voltage at the second output node Voutp. That is, the third current Ip1 flowing through the transistors T1 and T3 is greater than the fourth current Ip2 flowing through the transistor T2 and T4. Therefore, the second level current IL2 flowing through the transistor T5, mirrored from the first current Ip1, becomes larger to pull low the voltages at the third node V3 and the fourth node V4. As a result, the transistor T12 of the second output stage 223, controlled by the voltage at the third node V3, is turned on to pull high the output voltage at the second output node Voutp.

When the input voltage at the fourth input terminal Vin2+ (i.e. the fourth input signal) is less than the input voltage at the third input terminal Vin2− (i.e. the third input signal), the output buffer 220 is under a discharge state to pull low the output voltage at the second output node Voutp. That is, the fourth current Ip2 flowing through transistors T2 and T4 is greater than the third current Ip1 flowing through the transistors T1 and T3. Therefore, the second mirroring current Im2 flowing through the transistor T6, mirrored from the fourth current Ip2, becomes larger, such that the second level current IL2 flowing through the transistor T8, mirrored from the second mirroring current Im2, also becomes larger so as to pull high the voltages at the third node V3 and the fourth node V4. As a result, the transistor T11 of the second output stage 223, controlled by the voltage at the fourth node V4, is turned on to pull low the output voltage at the second output node Voutp.

In the embodiment of the present invention, the level adjustment circuit 222*a* is properly biased to adjust the voltages at the nodes V3 and V4, which controls the second output stage 223. In the level adjustment circuit 222*a*, the transistor T10 is biased by the first biased voltage Vb1 provided by the self-bias transistor M13 of the output buffer 210, and the transistor T9 is biased by the second biased voltage Vb2 provided by the self-bias transistor T13 of the output buffer 220. Therefore, the level adjustment circuit 222*a* dynamically adjusts levels of the nodes V3 and V4 responsive to the state of output buffer 220. In addition the level adjustment circuit 222*a* also keeps the gates of the transistors T11 and T12 having a small voltage offset for avoiding the transistors T11 and T12 to turn on simultaneously.

As the foregoing description of the output buffers 210 and 220, the first biased voltage Vb1 is equal to ($V_{GS}$_M13+$V_{GS}$_M7+Vss) and the second biased voltage Vb2 is equal to (Vdd−$V_{SG}$_T7−$V_{SG}$_T13), wherein $V_{GS}$ is a gate-source voltage of the transistor, and $V_{SG}$ is a source-gate voltage of the transistor. The first bias voltage Vb1 and the second bias voltage Vb2 for the level adjustment circuits 212*a* and 222*a* are respectively generated inside the output buffers 210 and 220, and there is no need to provide the bias from an external source, so as to save wire routings. Especially for a source driver, which may include hundreds of channels and each channel includes an output buffer, the wire routings can greatly simplified.

In summary, each of the output buffers utilizes two output stages to enhance the driving ability of the source driving circuit. In each output buffer, the first of the output stages utilizes the level adjustment circuit to dynamically adjust the level voltage according to the signals received by the differential input stage so as to control the last one of the output stages. In addition, the first of the output stages includes the self-bias providing circuit to bias the level adjustment circuit according to one of the induced currents in the differential input stage. Therefore, the output buffer can provide high rate charge current and high rate discharge current under the dynamic state, and operate more efficiently.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A source driving circuit, adapted to drive a display panel, comprising:

a first output buffer comprising:

a first differential input stage having a first input terminal for receiving a first input signal, and a second input terminal for receiving a second input signal, wherein a first current and a second current are generated in the first differential input stage respectively according to the first input signal and the second input signal; and a first output stage comprising:

a first level adjustment circuit for receiving a first level current mirrored from the first current and a first biased voltage to provide a first level voltage; and a first self-bias providing circuit for providing a first biased voltage to the first level adjustment circuit based on a second level current mirrored from the second current;

a second output stage for providing a first charge current and a first discharge current to output a first output signal based on the first level voltage; and a second output buffer comprising:

a second differential input stage having a third input terminal for receiving a third input signal, and a fourth input terminal for receiving a fourth input signal; and a third output stage comprising:

a second level adjustment circuit for providing a second level voltage according to the third input signal and the fourth input signal; and a second self-bias providing circuit for providing a second biased voltage to the first level adjustment circuit and the second level adjustment circuit, wherein the first self-bias providing circuit provides the first biased voltage to the second level adjustment circuit; and a fourth output stage for providing a second charge current and a second discharge current to output a second output signal based on the second level voltage.

2. The source driving circuit as claimed in claim 1, further comprising:

a multiplexer, selectively coupling the first output buffer and the second output buffer to a plurality of data lines of the display panel.

3. The source driving circuit as claimed in claim 1, wherein the first input signal and the second input signal are signals with a first polarity, and the third input signal and the fourth input signal are signals with a second polarity.

4. The source driving circuit as claimed in claim 1, wherein the first differential input stage comprises:

a first transistor, having a gate serving as the first input terminal, a first source/drain inducing the first current;

a second transistor, having a gate serving as the second input terminal, a first source/drain inducing the second current, and a second source/drain coupled to the second source/drain of the first transistor;

a third transistor, having a first source/drain coupled to a second voltage, and both of a gate and a second source/drain coupled to the first source/drain of the first transistor;

a fourth transistor, having a first source/drain coupled to the second voltage, and both of a gate and a second source/drain coupled to the first source/drain of the second transistor; and a first current source, coupled between the second source/drain of the first transistor and a first voltage for providing a first bias current to the first differential input stage, wherein a sum of the first current and the second current are near equal to the first bias current.

5. The source driving circuit as claimed in claim 4, wherein the first output stage further comprises:

a fifth transistor, having a gate coupled to the gate of the third transistor, a first source/drain coupled to the second voltage, and a second source/drain inducing the first level current mirrored from the first current;

a sixth transistor, having a gate coupled to the gate of the fourth transistor, a source/drain coupled to the second voltage, and a second source/drain;

a seventh transistor, having both of a gate and a first source/drain coupled to the second source/drain of the sixth transistor, and a second source/drain coupled to the first voltage; and an eighth transistor, having a gate coupled to the gate of the seventh transistor, a first source/drain inducing the first level circuit mirrored from the second current, and a second source/drain coupled to the first voltage.

6. The source driving circuit as claimed in claim 5, wherein the first level adjustment circuit comprises:

a ninth transistor, having a gate coupled to the first biased voltage, a first source/drain coupled to the second source/drain of the fifth transistor, and a second source/drain coupled to the first source/drain of the eighth transistor, wherein the first level voltage is outputted via one of the first source/drain and the second source/drain of the ninth transistor; and a tenth transistor, having a gate coupled to a second biased voltage, a first source/drain coupled to the first source/drain of the ninth transistor, and a second source/drain coupled to the second source/drain of the ninth transistor, wherein the first self-bias providing circuit comprises:

a first self-bias transistor, having both a gate and a first source/drain coupled together for receiving a first mirroring current mirrored from the second current to generate the first biased voltage, wherein the gate and the first source/drain of the first self-bias transistor couple to the second source/drain of the sixth transistor, and the second source/drain of the first self-bias transistor couples to the gate and the first source/drain of seventh transistor.

7. The source driving circuit as claimed in claim 6, wherein the second output stage comprises:

an eleventh transistor, having a gate coupled to the first source/drain of the ninth transistor, a first source/drain coupled to the second voltage, and a second source/drain outputting the first output signal; and a twelfth transistor, having a gate coupled to the second source/drain of the ninth transistor, a first source/drain coupled to the second source/drain of the eleventh transistor, and a second source/drain coupled to the first voltage.

8. The source driving circuit as claimed in claim 1, wherein a third current and a fourth current are generated in the second differential input stage respectively according to the third input signal and the fourth input signal, and the second level adjustment circuit receives a second level current mirrored from the third current or the fourth current to generate the second level voltage.

9. The source driving circuit as claimed in claim 8, wherein the second self-bias providing circuit generates the second biased voltage based on the fourth current.

10. The source driving circuit as claimed in claim 8, wherein the second differential input stage comprises:

a first transistor, having a gate serving as the third input terminal, a first source/drain inducing the third current;

a second transistor, having a gate serving as the fourth input terminal, a first source/drain inducing the fourth current, and a second source/drain coupled to the second source/drain of the first transistor;

a third transistor, having a first source/drain coupled to a first voltage, and both of a gate and a second source/drain coupled to the first source/drain of the first transistor;

a fourth transistor, having a first source/drain coupled to the first voltage, and both of a gate and a second source/drain coupled to the first source/drain of the second transistor; and a second current source, coupled between the second source/drain of the first transistor and a second voltage for providing a second bias current to the second differential input stage, wherein a sum of the third current and the fourth current are near equal to the second bias current.

11. The source driving circuit as claimed in claim 10, wherein the third output stage further comprises:

a fifth transistor, having a gate coupled to the gate of the third transistor, a first source/drain coupled to the first voltage, and a second source/drain inducing the second level current mirrored from the third current;

a sixth transistor, having a gate coupled to the gate of the fourth transistor, a source/drain coupled to the first voltage, and a second source/drain;

a seventh transistor, having both of a gate and a first source/drain coupled to the second source/drain of the sixth transistor, and a second source/drain coupled to the second voltage; and an eighth transistor, having a gate coupled to the gate of the seventh transistor, a first source/drain inducing the second level circuit mirrored from the fourth current, and a second source/drain coupled to the second voltage.

12. The source driving circuit as claimed in claim 11, wherein the second level adjustment circuit comprises:

a ninth transistor, having a gate coupled to the second biased voltage, a first source/drain coupled to the second source/drain of the fifth transistor, and a second source/drain coupled to the first source/drain of the eighth transistor, wherein the second level voltage is outputted via one of the first source/drain and the second source/drain of the ninth transistor; and a tenth transistor, having a gate coupled to the first biased voltage, a first source/drain coupled to the first source/drain of the ninth transistor, and a second source/drain coupled to the second source/drain of the ninth transistor, wherein the second self-bias providing circuit comprises:

a second self-bias transistor, having both a gate and a first source/drain coupled together, for receiving a second mirroring current mirrored from the fourth current to generate the second bias voltage, wherein the gate and the first source/drain of the second self-bias transistor couple to the second source/drain of the sixth transistor, and the second source/drain of the first self-bias transistor couples to the gate and the first source/drain of seventh transistor.

13. The source driving circuit as claimed in claim 12, wherein the fourth output stage comprises:

an eleventh transistor, having a gate coupled to the first source/drain of the ninth transistor, a first source/drain coupled to the first voltage, and a second source/drain outputting the second output signal; and a twelfth transistor, having a gate coupled to the second source/drain of the ninth transistor, a first source/drain coupled to the second source/drain of the eleventh transistor, and a second source/drain coupled to the first voltage.

* * * * *